（12) United States Patent
Sandhu

(10) Patent No.: US 9,331,275 B2
(45) Date of Patent: May 3, 2016

(54) SWITCHING DEVICE STRUCTURES AND METHODS

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/253,989

(22) Filed: Apr. 16, 2014

(65) Prior Publication Data

US 2014/0252301 A1  Sep. 11, 2014

Related U.S. Application Data

(63) Continuation of application No. 13/465,596, filed on May 7, 2012, now Pat. No. 8,737,114.

(51) Int. Cl.
*G11C 13/00* (2006.01)
*H01L 45/00* (2006.01)

(52) U.S. Cl.
CPC ........ *H01L 45/1253* (2013.01); *G11C 13/0002* (2013.01); *G11C 13/0007* (2013.01); *G11C 13/0011* (2013.01); *G11C 13/0016* (2013.01); *G11C 13/0069* (2013.01); *H01L 45/08* (2013.01); *H01L 45/085* (2013.01); *H01L 45/1206* (2013.01); *H01L 45/1233* (2013.01); *H01L 45/14* (2013.01); *H01L 45/141* (2013.01); *H01L 45/142* (2013.01); *H01L 45/143* (2013.01); *H01L 45/146* (2013.01); *H01L 45/147* (2013.01); *H01L 45/16* (2013.01);
(Continued)

(58) Field of Classification Search
CPC .................................................. G11C 13/0007

USPC .......................................................... 365/148
See application file for complete search history.

(56) References Cited

U.S. PATENT DOCUMENTS 6,740,921 B2 * 5/2004 Matsuoka et al. ............ 257/302
6,744,087 B2 * 6/2004 Misewich et al. ............ 257/295
(Continued)

FOREIGN PATENT DOCUMENTS

EP          1501124 A1    1/2005
JP       2003-229537 A    8/2003
(Continued)

OTHER PUBLICATIONS

The International Search Report and Written Opinion for related PCT application PCT/US2013/039931, mailed Sep. 23, 2013 (13 pages).
(Continued)

*Primary Examiner* — Son Mai
(74) *Attorney, Agent, or Firm* — Brooks, Cameron & Huebsch, PLLC

(57) ABSTRACT

Switching device structures and methods are described herein. A switching device can include a vertical stack comprising a material formed between a first and a second electrode. The switching device can further include a third electrode coupled to the vertical stack and configured to receive a voltage applied thereto to control a formation state of a conductive pathway in the material between the first and the second electrode, wherein the formation state of the conductive pathway is switchable between an on state and an off state.

20 Claims, 3 Drawing Sheets

(52) U.S. Cl.
CPC .... *G11C2013/0083* (2013.01); *G11C 2213/17* (2013.01); *G11C 2213/18* (2013.01); *G11C 2213/52* (2013.01); *G11C 2213/53* (2013.01)

(56) References Cited

U.S. PATENT DOCUMENTS

| | | | |
|---|---|---|---|
| 7,227,170 B2 * | 6/2007 | Ovshinsky | 257/2 |
| 7,804,085 B2 * | 9/2010 | Sunamura et al. | 257/4 |
| 7,960,217 B2 | 6/2011 | Schimmel et al. | |
| 8,189,365 B2 * | 5/2012 | Nakaya | 365/148 |
| 8,295,080 B2 | 10/2012 | Aizawa et al. | |
| 8,391,050 B2 * | 3/2013 | Ito | 365/148 |
| 8,737,114 B2 * | 5/2014 | Sandhu | 365/148 |
| 8,846,484 B2 * | 9/2014 | Lee et al. | 438/382 |
| 2005/0127524 A1 | 6/2005 | Sakamoto et al. | |
| 2006/0081962 A1 * | 4/2006 | Wei et al. | 257/537 |
| 2006/0164880 A1 | 7/2006 | Sakamoto et al. | |
| 2007/0285148 A1 | 12/2007 | Sakamoto et al. | |
| 2009/0020742 A1 * | 1/2009 | Sunamura et al. | 257/4 |
| 2010/0246240 A1 | 9/2010 | Nakaya | |
| 2010/0327255 A1 | 12/2010 | Peng et al. | |
| 2011/0006278 A1 | 1/2011 | Takahashi | |
| 2011/0057163 A1 | 3/2011 | Liu et al. | |
| 2011/0149633 A1 | 6/2011 | Ahn et al. | |
| 2011/0241067 A1 | 10/2011 | Schimmel et al. | |

FOREIGN PATENT DOCUMENTS

| | | |
|---|---|---|
| JP | 2006-339667 A | 12/2006 |
| JP | 2008-235704 A | 10/2008 |
| JP | 2010-287744 A | 12/2010 |
| JP | 2013-157444 A | 8/2013 |
| KR | 20060055437 A | 5/2006 |
| KR | 10-0647332 B1 | 11/2006 |
| KR | 10-2011-0072921 A | 6/2011 |
| WO | 2009096363 A1 | 8/2009 |

OTHER PUBLICATIONS

Hino, et al., "Atomic Switches: Atomic-Movement-Controlled Nanodevices for New Types of Computing," IOP Science, Mar. 11, 2011, 13 pages, Retrived from: http://iopscience.iop.org/1468-6996/12/1/013003.

Notice of Reasons for Rejection from related Korean patent application No. 10-2014-7033703, dated Apr. 30, 2015, 11 pp.

Office Action from related Taiwanese patent application No. 102116248, dated Jun. 18, 2015, 12 pp.

Notice of Rejection from related Japanese patent application No. 2015-511619, dated Nov. 17, 2015, 9 pp.

Notice of Reasons for Rejection from related Korean patent application No. 10-2014-7033703, dated Nov. 17, 2015, 7 pp.

Extended Search Report from related European patent application No. 13787091.1, dated Jan. 18, 2016, 7 pp.

Notice of Reasons for Rejection from related Korean patent application No. 10-2014-7033703, dated Feb. 24, 2016, 11 pp.

\* cited by examiner

SWITCHING DEVICE STRUCTURES AND METHODS

PRIORITY INFORMATION

The present application is a continuation of U.S. application Ser. No. 13/465,596 filed May 7, 2012, which is incorporated by reference.

TECHNICAL FIELD

The present disclosure relates generally to switching device structures and methods.

BACKGROUND

A switching device is an electrical component that can break an electrical circuit, interrupting the current or diverting it from one conductor to another. A switching device may include semiconductor devices such as bipolar junction transistors or field-effect transistors and a number of terminals. When a control signal is applied to the switching device, it may open and/or close. When the switching device is closed, a small residual resistance may remain between the number of terminals.

Memory devices are typically provided as internal, semiconductor, integrated circuits in computers or other electronic devices. There are many different types of memory, including random-access memory (RAM), read only memory (ROM), dynamic random memory (DRAM), synchronous dynamic random access memory (SDRAM), flash memory, and resistive, e.g., resistance variable, memory, among others. Types of resistive memory include programmable conductor memory, phase change random access memory (PCRAM), and resistive random access memory (RRAM), among others.

Memory devices are utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices may include a number of memory cells arranged in a matrix, e.g., array. A resistive memory cell can comprise a resistive storage element and a select device. As an example a select device can be a diode, a field effect transistor (FET), or bipolar junction transistor (BJT), among other switching devices used to select, e.g., access, a memory cell. The select device of a memory cell can be coupled to, for example, an access line, e.g., word line, forming a "row" of the array. The storage elements of each memory cell may be coupled to a data/sense line, e.g., bit line, in a "column" of the array. In this manner, the select of a memory cell may be accessed through a row decoder activating a row of memory cells by selecting the word line coupled to their gates. The programmed state of a row of selected memory cells may be determined, e.g., sensed, by causing different currents to flow in the memory elements depending on the resistance associated with a programmed state of a selected memory cell.

Memory cells may be programmed, e.g., written, to a desired state. That is, one of a number of programmed states, e.g., resistance levels, can be set for a memory cell. For example, a single level cell (SLC) can represent one of two logic states, e.g., 1 or 0. Resistive memory cells can also be programmed to one of more than two programmed states, such as to represent more than two binary digits, e.g., 1111, 0111, 0011, 1011, 1001, 0001, 0101, 1101, 1100, 0100, 0000, 1000, 1010, 0010, 0110, or 1110. Such cells may be referred to as multi state memory cells, multi-digit cells, or multilevel cells (MLCs).

DETAILED DESCRIPTION

Figure 1A:
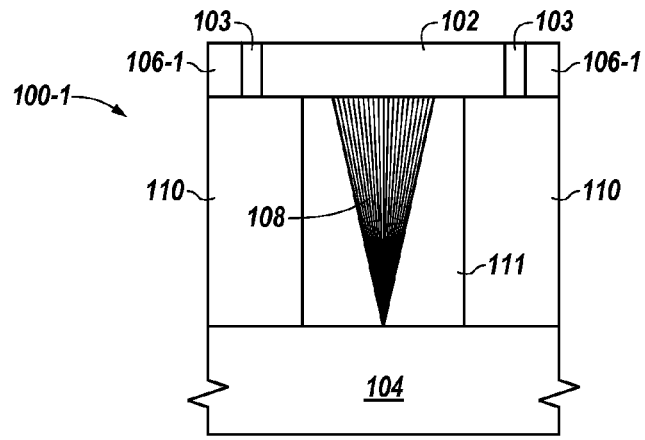
FIGS. 1A-1C illustrate cross-sectional views of a switching device in accordance with one or more embodiments of the present disclosure.

Switching device structures and methods are described herein. One or more switching devices can include a vertical stack comprising a material formed between a first and a second electrode. The switching devices can further include a third electrode coupled to the vertical stack and configured to receive a voltage applied thereto to control a formation state of a conductive pathway in the material between the first and the second electrode, wherein the formation state of the conductive pathway is switchable between an on state and an off state.

Switching device structures and methods, in accordance with embodiments of the present disclosure, can provide for a three-electrode, e.g., three-terminal, scalable device that can function as a transistor rather than a diode and/or resistor, for example. Various switching devices in accordance with embodiments described herein can comprise an electrode, e.g., a gate electrode, having a different location as compared to previous switching devices, which can provide for an increased electric field within the switching device, as compared to previous switching devices. The electric field may also be formed at a number of different angles, resulting in a smaller, more compact device as compared to devices designed to operate via electric fields of approximately 90 degrees. For example, a planar device in which the making and/or breaking of a conductive pathway (e.g., conductive filament) is performed via electric fields acting at 90 degrees may result in a larger device as compared to a more compact, vertical switching device, as described further herein with respect to embodiments of the present disclosure.

In a number of embodiments, a switching device can function similar to a transistor and may be used to amplify and/or switch electronic signals and power, for example. Switching devices, in accordance with embodiments of the present disclosure, can be more compact in size and can have a greater areal density as compared to previous transistors, e.g., field effect transistors (FETs) performing a same or similar switching function.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice a number of embodiments of this disclosure, and it is to be understood that other embodiments may be utilized and that process, electrical, or mechanical changes may be made without departing from the scope of the present disclosure.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense. As used herein, "a number of" something can refer to one or more such things. For example, a number of memory devices can refer to one or more memory devices.

The various processing stages described herein, including formation of components using materials, can include the use of deposition of material in a number of ways known in the art. Some examples include chemical vapor deposition (CVD) and/or atomic layer deposition (ALD), among others. Processing stages involving the removal of material can include the use of, for example, photolithography, patterning, wet and/or dry etching, and the like, as will be appreciated by one of skill in the art.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIGS. 1A-1C, and a similar element may be referenced as 400 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

Figure 1B:
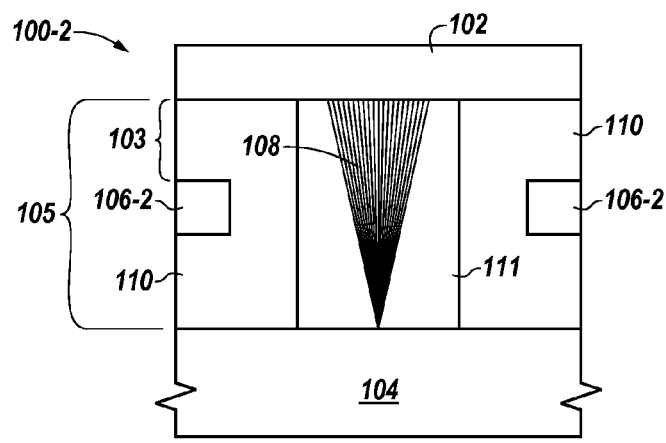
Figure 1C:
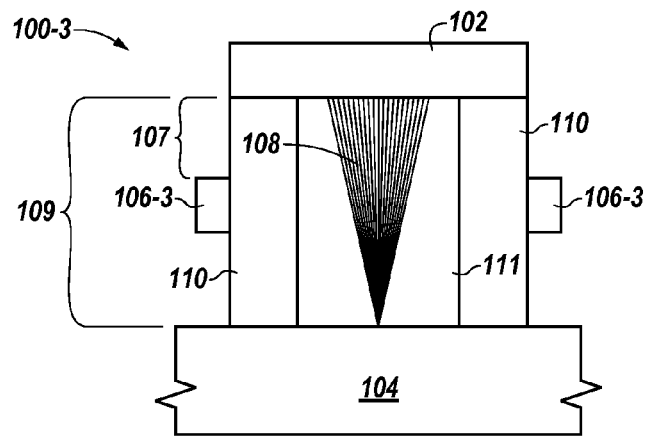

FIGS. 1A-1C illustrate cross-sectional views of a switching device 100 in accordance with one or more embodiments of the present disclosure. In a number of embodiments, switching device 100 operates, e.g., switches between an "on" state and an "off" state, via ion movement. As such, switching device 100 can be referred to as a nanoionic switching device. As illustrated in FIGS. 1A-1C, a switching device 100 can include an electrode 102, an electrode 104, and an electrode 106. The electrodes 102, 104, and 106 can comprise, for example, a conductive material, e.g., tungsten, titanium nitride, etc. Device 100 can be formed on a substrate (not shown), which can be a silicon substrate, silicon on insulator (SOI) substrate, or silicon on sapphire (SOS), among various other substrate materials. Device 100 can be pillar-shaped or mesa shaped, among others, for example.

Operation of switching devices, such as switching devices 100-1, 100-2, and 100-3 illustrated in FIGS. 1A, 1B, and 1C, respectively, can be controlled via application of electrical signals, which results in diffusion of ions, e.g., metal ions, and their reduction and/or oxidation processes in a switching operation to form and/or annihilate a conductive pathway, e.g., a conductive filament and/or a metal atomic bridge. In a number of embodiments, the conductive pathway can include, for example any type of conductive path and/or volume which can be created under applied field. For example, in mixed valence oxide (MVO), materials such as PCMO ($Pr_x$-$Ca_yMg_zO$), oxygen vacancies can uniformly move under an applied electrical field in a volume of materials and change its resistance without forming a filament.

The conductive pathway can create a conductive path between two electrodes of the switching device, e.g., in an on state. In a number of embodiments, such an atomic switching device can be a three electrode device and can perform a similar function as a transistor. Device 100 can demonstrate electrical performance similar to a complementary metal-oxide-semiconductor (CMOS) device, for example.

FIG. 1A illustrates a cross-sectional view of a switching device 100-1. The switching device 100-1 includes an electrode 106-1 formed adjacent to and surrounding an electrode 102. In a number of embodiments, the electrode 106-1 is adjacent to, but does not surround electrode 102. As illustrated in FIG. 1A, insulating material 103 can be formed between electrode 106-1 and electrode 102 to isolate them from one another, for example. A material 110 is formed between an electrode 104 and electrodes 102 and 106-1, and within material 110 can be material 111. Material 110 can be, for example, an interlayer dielectric, such as, a nitride dielectric, e.g., silicon nitride ($Si_3N_4$). In a number of embodiments, material 111 can comprise a resistance variable material. In embodiments in which material 111 is a resistance variable material, the material 111 can be, for example, an RRAM material. In a number of embodiments, material 111 can be formed between electrodes 104, 102, and 106-1.

Example RRAM materials can include, for example, zirconium dioxide ($ZrO_2$) or gadolinium oxide ($GdO_x$). Other RRAM materials can include, for example, colossal magnetoresistive materials such as $Pr_{(1-x)}Ca_xMnO_3$ (PCMO), $La_{(1-x)}Ca_xMnO_3$ (LCMO), and $Ba_{(1-x)}Sr_xTiO_3$. RRAM materials can also include metal oxides, such as alkaline metal oxides, e.g., $Li_2O$, $Na_2O$, $K_2O$, $Rb_2O$, $Cs_2O$, BeO, MgO, CaO, SrO, and BaO, refractive metal oxides, e.g., NbO, $NbO_2$, $Nb_2O5$, $MoO_2$, $MoO_3$, $Ta_2O_5$, $W_2O_3$, $WO_2$, $WO_3$, $Re_2O_2$, $ReO_3$, and $Re_2O_7$, and binary metal oxides, e.g., $Cu_xO_y$, $WO_x$, $Nb_2O_5$, $Al_2O_3$, $Ta_2O_5$, $TiO_x$, $ZrO_x$, $Ni_xO$, and $Fe_xO$. RRAM materials can also include $Ge_xSe_y$, and other materials that can support solid phase electrolyte behavior. In some embodiments, materials for ionic memories can include a reactive ion and a solid electrolyte material. The reactive ion in current devices can include, for example Cu, Ag, and/or Zn. The solid electrolyte can include, for example, metal sulfides, Ge-based chalcogenides, and/or oxides.

Other RRAM materials can include perovskite oxides such as doped or undoped $SrTiO_3$, $SrZrO_3$, and $BaTiO_3$, and polymer materials such as Bengala Rose, $AlQ_3Ag$, Cu-TCNQ, DDQ, TAPA, and Fluorescine-based polymers, among other types of RRAM materials. Embodiments of the present disclosure are not limited to a particular type of RRAM material.

As shown in FIG. 1A, switching device 100-1 is a vertical stack of materials. In operation, a voltage can be applied to electrodes 102, 104, and/or 106-1 to control a formation state of a conductive pathway 108, e.g., a conductive filament, in material 111. In a number of embodiments, the formation state of the conductive pathway 108 is switchable between an on state, e.g., conducting, and an off state, e.g., non-conducting. Voltages can be applied to electrodes 102, 104, and/or 106-1 such that a combined voltage difference between electrodes 102/106-1 and 104 creates an electric field sufficient to control the formation state, for example.

In a number of embodiments, electrode 102 can serve as a source electrode, electrode 104 can serve as a drain electrode, and electrode 106-1 can serve as a gate electrode of the switching device 100-1. Electrode 102 can be formed as a contact pillar, for example. The electrodes 104 and 106-1 can be formed as conductive lines, or the switching device 100-1 can be formed as a vertical pillar, for instance. In the example illustrated in FIG. 1A, electrodes 102 and 106-1 can be controlled independently of one another. In a number of embodiments, electrodes 102 and 106-1 can be controlled together and can function together as a single electrode.

FIG. 1B illustrates a cross-sectional view of a switching device 100-2. The switching device 100-2 includes an electrode 106-2 formed within a material 110 and/or a material 111. In the example illustrated in FIG. 1B, switching device 100-2 is a vertical stack of materials. In operation, a voltage can be applied to electrodes 102, 104, and/or 106-2 to control a formation state of a conductive pathway 108 within material 111. Voltages can be applied to electrodes 102, 104, and 106-2 such that a combined voltage difference between electrodes 102/106-2 and 104 creates an electric field sufficient to control the formation state, for example.

FIG. 1C illustrates a cross-sectional view of a switching device 100-3. The switching devices 100-3 includes an electrode 106-3 formed outside of a material 110. In some examples, electrode 106-3 can be formed outside of material 111. In the example illustrated in FIG. 1C, switching device 100-3 is a vertical stack of materials. In operation, a voltage can be applied to electrodes 102, 104, and/or 106-3 to control a formation state of a conductive pathway 108 in material 111. As illustrated in FIG. 1C, electrode 106-3 can be formed between electrodes 102 and 104 and/or surrounding a portion of material 110. In some examples, electrode 106-3 can be formed between electrodes 102 and 104 and/or surrounding a portion of material 111. In a number of embodiments, a distance 107 between electrodes 102 and 106-3 is less than a distance 109 between electrodes 102 and 104. This can result in an increased electric field between electrodes 106-3 and 104, as compared to an electric field between electrodes 106-1 and 104 of switching device 100-1 shown in FIG. 1A. The electrodes 102 and 106-3 can be controlled independently of one another, e.g., separate voltages can be applied to electrodes 102 and 106-3.

FIG. 1C illustrates a cross-sectional view of a switching device 100-3. The switching devices 100-3 includes an electrode 106-3 formed outside of a material 110. In some examples, electrode 106-3 can be formed outside of material 111. In the example illustrated in FIG. 1B, switching device 100-3 is a vertical stack of materials. In operation, a voltage can be applied to electrodes 102, 104, and/or 106-3 to control a formation state of a conductive pathway 108 in material 111. As illustrated in FIG. 1B, electrode 106-3 can be formed between electrodes 102 and 104 and/or surrounding a portion of material 110. In some examples, electrode 106-3 can be formed between electrodes 102 and 104 and/or surrounding a portion of material 111. In a number of embodiments, a distance 107 between electrodes 102 and 106-3 is less than a distance 109 between electrodes 102 and 104. This can result in an increased electric field between electrodes 106-3 and 104, as compared to an electric field between electrodes 106-1 and 104 of switching device 100-1 shown in FIG. 1A. The electrodes 102 and 106-3 can be controlled independently of one another, e.g., separate voltages can be applied to electrodes 102 and 106-3.

In a number of embodiments, a switching device structure such as switching devices 100-1, 100-2, and 100-3 can be operated as a memory cell. For instance, voltages can be applied to the electrodes of the switching device to control formation of the conductive pathway 108, which can represent a programmed state, and annihilation of the conductive pathway 108, which can represent an erased state.

In a number of embodiments, a switching device such as switching devices 100-1, 100-2, and 100-3 can be coupled to a storage element to form a memory cell. As will be discussed further herein with respect to FIG. 3, the switching device can be coupled in series with the storage element which can be a resistive storage element for instance.

Figure 2:
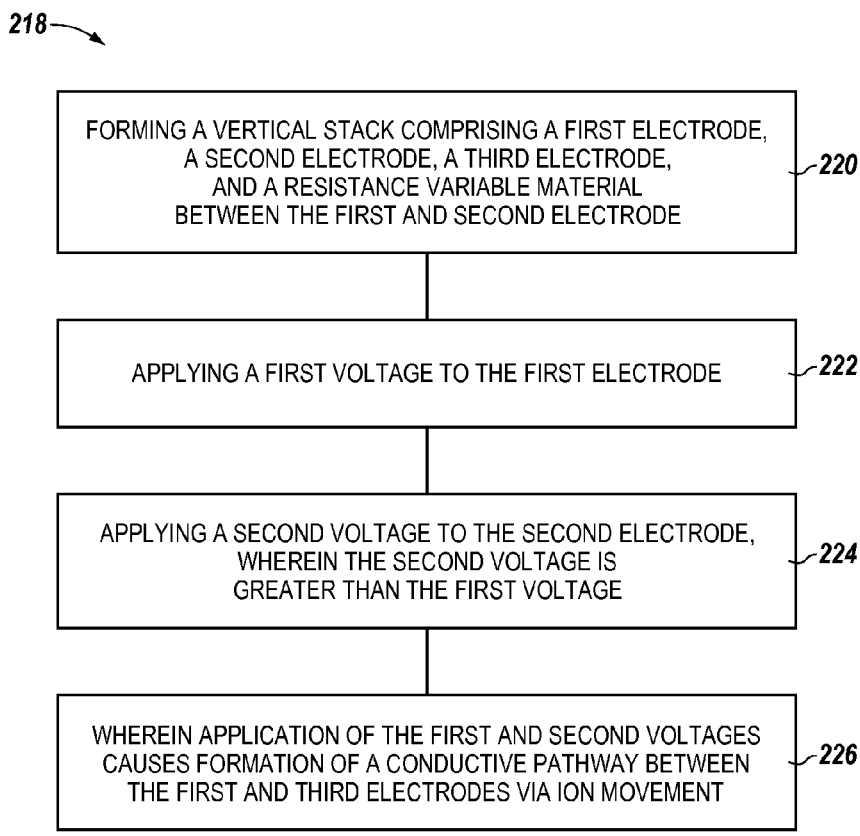
FIG. 2 is a flow chart illustrating an example of a method for forming a conductive pathway in accordance with one or more embodiments of the present disclosure.

FIG. 2 is a flow chart illustrating an example of a method 218 for forming a conductive pathway in accordance with one or more embodiments of the present disclosure. At 220, a vertical stack comprising a first electrode, a second electrode, a third electrode, and a resistance variable material between the first and second electrodes is formed. In a number of embodiments, the vertical stack can comprise a switching device such as devices 100-1, 100-2, and 100-3 described in connection with FIGS. 1A-1C.

At 222, a first voltage is applied to the first electrode, which can be a source electrode, for instances. At 224, a second voltage is applied to the second electrode which can be a gate electrode. In a number of embodiments, the second voltage is greater than the first voltage; however, embodiments are not so limited. The voltages applied to the first and second electrodes can be sufficient such that an electric field between the first/second electrodes and the third electrode, e.g., a drain electrode, results in formation of a conductive pathway between the first and third electrodes, e.g., source and drain electrodes, for instance. This can result in the switching device functioning as a transistor. In a number of embodiments, the first and second electrodes can be controlled separately. As illustrated at 226, the conductive pathway can be formed via ion movement, and in a number of embodiments, can cause the switching device to function as a transistor. In a number of embodiments, the total voltage difference between the first/second electrodes and the third electrode can be controlled by applying different voltages to the first and second electrodes, e.g., by controlling the first and second electrodes separately.

As such, the conductive pathway can be controlled by applying a voltage, e.g., a required bias, between the gate electrode and the drain electrode, or by controlling a cumulative electric field between the drain electrode and the source/gate electrode of the switching device. The state of the switching device can be sensed by measuring current between the source electrode and the drain electrode. In a number of embodiments, the switching device can be coupled to an RRAM or conductive-bridging RAM (CBRAM) storage element, among others.

Figure 3:
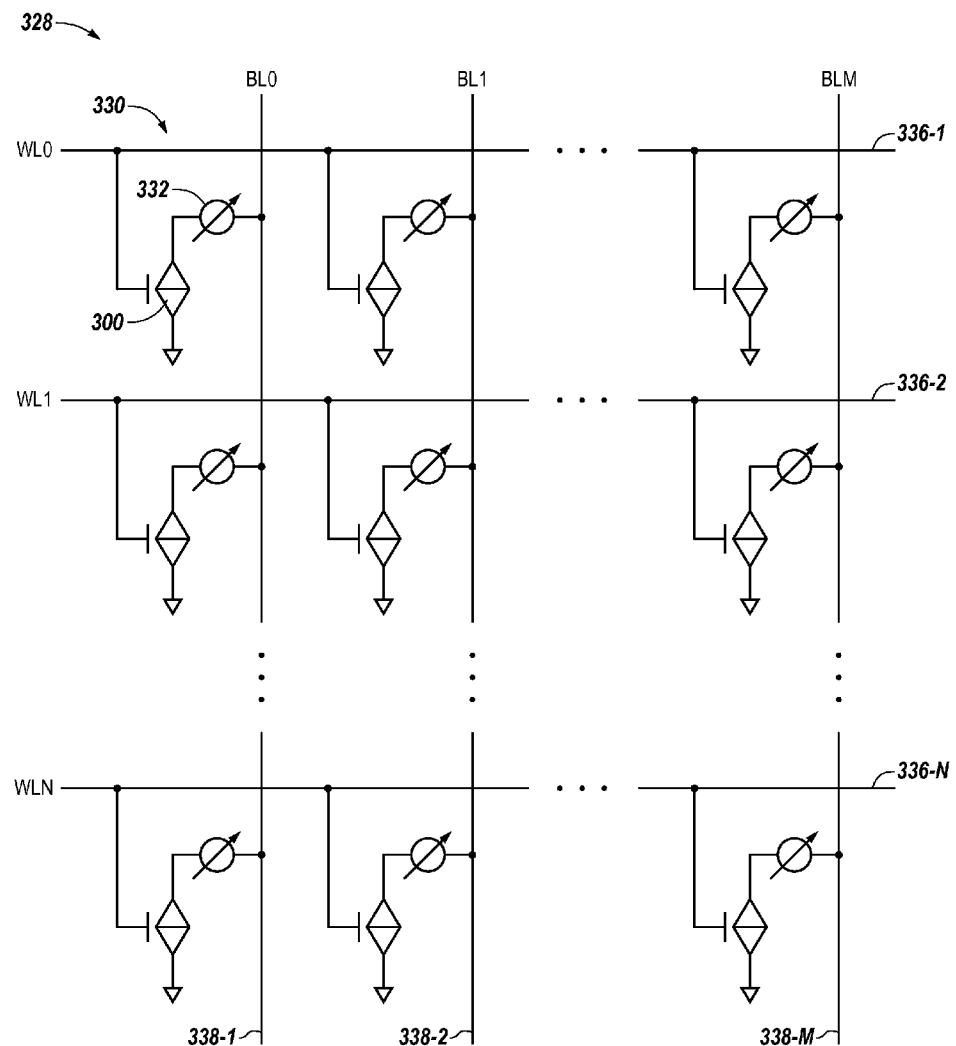
FIG. 3 is a schematic diagram of a portion of a resistive memory array including switching devices in accordance with one or more embodiments of the present disclosure.

FIG. 3 is a schematic diagram of a portion of a resistive memory array 328 including switching devices 300 in accordance with one or more embodiments of the present disclosure. The resistive memory array 328 includes a number of memory cells 330, each including a switching device 300 coupled to a resistive storage element 332. Resistive storage element 332 can include resistance variable materials such as those described in FIGS. 1A-1C. Resistive storage element 332, can include a two-terminal resistance variable storage element comprising a storage material between a pair of electrodes, for example. The switching device can serve as a select device for the memory cell, in a number of embodiments.

A switching device 300 can include a vertical stack comprising a material formed between two electrodes, and the switching device 300 can include a third electrode coupled to the vertical stack and configured to receive a voltage applied thereto to control a formation state of a conductive pathway, e.g., a conductive pathway. The formation state can be switchable between an on state and an off state in a number of embodiments.

In the example illustrated in FIG. 3, switching device 300 is coupled in series with resistive storage element 332 to form memory cell 330. The switching device 300 can be a switching device such as those described in FIGS. 1A-1C. The memory cells 330 can be formed in accordance with embodiments described herein.

In the example illustrated in FIG. 3, the switching device 300 is a three terminal switching device. As shown in FIG. 3, an electrode, e.g., a gate electrode, of each switching device 300 is coupled to one of a number of word lines 336-1 (WL0), 336-2 (WL1), . . . , 336-N (WLN), i.e., each word line 336-1, 336-2, . . . , 336-N is coupled to a row of memory cells 330. The designator "N" is used to indicate that the resistive memory array 328 can include a number of word lines.

In the example illustrated in FIG. 3, each resistive storage element 432 is coupled to one of a number of bit lines 338-1 (BL0), 338-2 (BL1), . . . , 338-M (BLM), i.e., each bit line 338-1, 338-2, . . . , 338-M is coupled to a column of memory cells 330. The designator "M" is used to indicate that the resistive memory array 328 can include a number of bit lines. The designators M and N can have various values. For instance, M and N can be 64, 128, or 256. In some embodiments, a bit line direction is perpendicular to a word line direction, e.g., the rows of memory cells 330 and the columns of memory cells 330 are perpendicular to one another.

The switching devices 300 can be operated, e.g., turned on/off, to select/deselect the memory cells 330 in order to perform operations such as data programming, e.g., writing, and/or data reading operations, for instance. In operation, appropriate voltage and/or current signals, e.g., pulses, can be applied to the bit lines and word lines in order to program data to and/or read data from the memory cells 330. As an example, the data stored by a memory cell 330 of array 328 can be determined by turning on a switching device 300, and sensing a current through the resistive storage element 332. The switching device 300 can be turned on/off via ion movement resulting in formation/annihilation of a conductive pathway as described further above. The current sensed on the bit line corresponding to a selected memory cell 330 being read corresponds to a resistance level of the resistance variable material of resistive storage element 332, which in turn may correspond to a particular data state, e.g., a binary value. The resistive memory array 328 can have architecture other than that illustrated in FIG. 3, as will be understood by one of ordinary skill in the art. In the example shown in FIG. 3, an electrode, e.g., a drain electrode, of switching device is coupled to a ground voltage. However, embodiments are not so limited.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A switching device, comprising:
    a stack comprising a first material and a second material formed between a first and a second electrode; and
    a third electrode formed between the first and second electrode, formed outside of the first material and the second material, coupled to the stack, and configured to receive a voltage applied thereto to control a formation state of a conductive pathway in the first material between the first and the second electrode;
    wherein the formation state of the conductive pathway is switchable between an on state and an off state.

2. The device of claim 1, wherein the third electrode is formed within a portion of the first material.

3. The device of claim 1, wherein the third electrode surrounds a portion of the first material.

4. The device of claim 1, wherein the second electrode is configured to receive a voltage applied thereto in combination with the voltage applied to the third electrode to control the formation state.

5. The device of claim 1, wherein the second electrode is formed on a pillar.

6. The device of claim 1, wherein a distance between the first and the third electrodes is less than a distance between the first and the second electrodes.

7. The device of claim 1, wherein the third electrode is coupled to a conductive line.

8. The device of claim 1, wherein the first material includes a resistance variable material.

9. The device of claim 8, wherein the resistance variable material is a resistive random-access memory material.

10. The device of claim 8, wherein the resistance variable material includes a transition metal oxide material.

11. The device of claim 8, wherein the resistance variable material includes a metal alloy material.

12. A memory cell, comprising:
    a storage element;
    a switching device coupled in series with the storage element, the switching device comprising:
        a vertical stack comprising a first material and a second material formed between a first and a second electrode; and
        a third electrode formed between the first and the second electrode and outside of the first material and the second material, coupled to the vertical stack, and configured to receive a voltage applied thereto to control a formation state of a conductive pathway in the first material between the first and the second electrode;
        wherein the formation state of the conductive pathway is switchable between an on state and an off state.

13. The memory cell of claim 12, wherein the storage element is a two-electrode resistance variable storage element comprising a storage material between a pair of electrodes.

14. The memory cell of claim 12, wherein the switching device serves as a select device for the memory cell.

15. The memory cell of claim 12, wherein the first electrode is a drain electrode, the second electrode is a source electrode, and the third electrode is a gate electrode.

16. The memory cell of claim 12, wherein the first electrode is coupled to a conductive line.

17. A method of forming a conductive pathway, comprising:
    forming a vertical stack comprising a first electrode, a second electrode, a third electrode between the first and the second electrodes and surrounding a resistance variable material and a dielectric material between the first and second electrode, applying a first voltage to the first electrode; and applying a second voltage to the second electrode, wherein the second voltage is greater than the first voltage, wherein application of the first and second voltages cause formation of a conductive pathway between the first and third electrodes via ion movement.

18. The method of claim 17, further comprising controlling the conductive pathway by controlling a cumulative electric field between the first and third electrodes.

19. The method of claim 17, wherein the conductive pathway includes a conductive filament.

20. The method of claim 17, wherein the conductive pathway includes a metal atomic bridge.

* * * * *